(12) United States Patent
Abe

(10) Patent No.: US 11,066,248 B2
(45) Date of Patent: Jul. 20, 2021

(54) ARTICLE TRANSPORT DEVICE

(71) Applicant: Daifuku Co., Ltd., Osaka (JP)

(72) Inventor: Takeshi Abe, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 280 days.

(21) Appl. No.: 16/446,841

(22) Filed: Jun. 20, 2019

(65) Prior Publication Data
US 2020/0010280 A1    Jan. 9, 2020

(30) Foreign Application Priority Data

Jul. 5, 2018  (JP) .............................. JP2018-128501

(51) Int. Cl.
| | |
|---|---|
| B65G 35/06 | (2006.01) |
| B65G 65/08 | (2006.01) |
| B65G 47/22 | (2006.01) |
| H01L 21/67 | (2006.01) |
| H01L 21/677 | (2006.01) |
| H01L 21/673 | (2006.01) |

(52) U.S. Cl.
CPC ............. *B65G 35/06* (2013.01); *B65G 47/22* (2013.01); *B65G 65/08* (2013.01); *H01L 21/673* (2013.01); *H01L 21/67727* (2013.01); *H01L 21/67736* (2013.01); *B65G 2201/0297* (2013.01)

(58) Field of Classification Search
CPC ........ B65G 35/06; B65G 47/22; B65G 65/08; B65G 2201/0297; H01L 21/673; H01L 21/67727; H01L 21/67736
See application file for complete search history.

(56) References Cited

U.S. PATENT DOCUMENTS

| | | | | |
|---|---|---|---|---|
| 2017/0152111 | A1* | 6/2017 | Kinugawa | ......... H01L 21/67733 |
| 2018/0122671 | A1* | 5/2018 | Niiyama | ............. H01L 21/6773 |
| 2019/0019707 | A1* | 1/2019 | Suzuki | ........................ B25J 9/04 |

FOREIGN PATENT DOCUMENTS

JP        2016216137 A      12/2016

* cited by examiner

*Primary Examiner* — Saul Rodriguez
*Assistant Examiner* — Ashley K Romano
(74) *Attorney, Agent, or Firm* — The Webb Law Firm

(57) ABSTRACT

The article transport device includes a transport vehicle configured to move back and forth between a receiving location and a delivery location, and a load receiving base that is provided at at least the receiving location. The transport vehicle includes a transport placing base on which an article is to be placed, and a lift device configured to raise and lower the transport placing base to a first height and to a second height that is lower than the first height. The load receiving base is a base on which an article is to be placed, and is fixed at a third height that is between the first height and the second height. When the transport vehicle performs restoration movement to move from the delivery location to the receiving location, the lift device performs a restoration operation that differs in accordance with whether or not an article is present on the load receiving base at the receiving location.

8 Claims, 8 Drawing Sheets

Fig.8

| | RECEIVING LOCATION | TRANSPORT MOVEMENT | DELIVERY LOCATION |
|---|---|---|---|
| 1 | DIRECT TRANSFER | | DIRECT TRANSFER |
| 2 | DIRECT TRANSFER | | LOAD RECEIVING BASE TRANSFER |
| 3 | LOAD RECEIVING BASE TRANSFER | | DIRECT TRANSFER |
| 4 | LOAD RECEIVING BASE TRANSFER | | LOAD RECEIVING BASE TRANSFER |

Fig.9

| | RECEIVING LOCATION | RESTORATION MOVEMENT | DELIVERY LOCATION |
|---|---|---|---|
| 1 | NO ARTICLE PRESENT | | DIRECT TRANSFER |
| 2 | ARTICLE PRESENT | | DIRECT TRANSFER |
| 3 | NO ARTICLE PRESENT | | LOAD RECEIVING BASE TRANSFER |
| 4 | ARTICLE PRESENT | | LOAD RECEIVING BASE TRANSFER |

ARTICLE TRANSPORT DEVICE

CROSS-REFERENCE TO RELATED APPLICATION

This application claims priority to Japanese Patent Application No. 2018-128501 filed Jul. 5, 2018, the disclosure of which is hereby incorporated by reference in their entirety.

BACKGROUND OF THE INVENTION

1. Field of the Invention

The present invention relates to an article transport device for transporting an article from a receiving location to a delivery location.

2. Description of the Related Art

For example, JP 2016-216137A (Patent Document 1) discloses an article transport device [4] that is arranged to extend from the outside of a tubular member [5] to the inside thereof and transports an article [1] between an outside location [8] that is set outside the tubular member [5] and an inside location [9] that is set inside thereof. For example, the article transport device [4] receives an article [1] from a ceiling transport vehicle [3] at the outside location [8], transports this article [1] to the inside location [9], and delivers the article [1] to a lift-type transport device [2] at the inside location [9].

The article transport device [4] includes a transport placing base [41] that moves in the vertical direction, and receives the article [1] using the transport placing base [41]. For example, the article [1] is received as a result of the transport placing base [41] being raised from a position lower than a placing body [43] to a position higher than the placing body [43], with the article [1] placed on the placing body [43] at the outside location [8] by the ceiling transport vehicle [3], and the article [1] being transferred from the placing body [43] to the transport placing base [41]. The article transport device [4] then transports the article [1] to the inside location [9] while keeping the transport placing base [41] at a raised position [occupied moving height]. Next, the transport placing base [41] is lowered from the position higher than the placing body [43] to the position lower than the placing body [43], and the article [1] is delivered to a placing body [44] at the inside location [9]. Thereafter, the article transport device [4] restores the transport placing base [41] to the outside location [8] while keeping the transport placing base [41] at a lowered position [non-occupied moving height]. In the case where the next article [1] is placed onto the placing body [43] at the outside location [8] by the ceiling transport vehicle [3] as well, the article transport device [4] transports the article [1] in accordance with the same procedure.

SUMMARY OF THE INVENTION

In the case of the article transport device [4] disclosed in Patent Document 1, the transport placing base [41] is kept at the lowered position [non-occupied moving height] until an article [1] is placed onto the placing body [43] at the outside location [8], and the transport placing base [41] is raised to perform an operation to receive the article [1] after the article [1] is placed onto the placing body [43]. For this reason, a certain period of time is required to start transporting the article [1] toward the inside location [9].

Also, in the case of the article transport device [4] disclosed in Patent Document 1, after an article [1] has been delivered to the placing body [44] at the inside location [9], the transport placing base [41] is set at the lowered position [non-occupied moving height] and waits at the lowered position [non-occupied moving height] at the outside location [8] as well until the next article [1] is placed onto the placing body [43]. For this reason, when the transport placing base [41] is restored to the outside location [8] after an article [1] has been delivered at the inside location [9], the transport placing base [41] is restored while being kept at the lowered position [non-occupied moving height]. That is to say, in the case of the article transport device [4] disclosed in Patent Document 1, the restoration operation of the transport placing base [41] is always performed in the same manner regardless of whether or not an article [1] is present at the outside location [8].

In view of the foregoing situation, there is a demand for realizing an article transport device capable of shortening the cycle time by efficiently operating the transport placing base.

An article transport device according to the present disclosure is an article transport device for transporting an article from a receiving location to a delivery location including: a transport vehicle configured to move back and forth between the receiving location and the delivery location; a path forming portion configured to connect the receiving location to the delivery location and to form a path through which the transport vehicle moves; and a load receiving base provided at at least the receiving location, wherein the transport vehicle includes a transport placing base on which an article is to be placed, and a lift device configured to raise and lower the transport placing base to a first height and to a second height that is lower than the first height, the load receiving base is a base on which an article is to be placed, and is fixed at a third height that is between the first height and the second height, the transport vehicle receives an article at the receiving location as a result of the article being placed onto the transport placing base positioned at the first height, or as a result of the transport placing base being raised from the second height to the first height with the article placed on the load receiving base, and the article being placed onto the transport placing base, and delivers the article at the delivery location, and when the transport vehicle performs restoration movement to move from the delivery location to the receiving location, the lift device performs a restoration operation that differs in accordance with whether or not an article is present on the load receiving base at the receiving location.

According to this configuration, if an article is to be received by being placed onto the transport placing base positioned at the first height, the transport placing base waits in the first-height state at the receiving location, and thus, the article can be directly received on the transport placing base. Accordingly, transport of the article to the delivery location can be started early. Also, according to this configuration, different restoration operations are performed in accordance with the situation after the article has been delivered at the delivery location, and thus, a preparation operation for transporting the next article can be performed efficiently. The above configuration makes it possible to cause the transport placing base to operate efficiently, and shorten the cycle time of the article transport device.

Further features and advantages of the technology according to the present disclosure will be more apparent through the description of the following exemplary and non-limiting embodiments, which will be described with reference to drawings.

BRIEF DESCRIPTION OF THE DRAWINGS

FIG. 8 illustrates an operation of a lift device (transport placing base) when an article is transferred from the receiving location to the delivery location.

FIG. 9 illustrates an operation of the lift device (transport placing base) when being restored from the delivery location to the receiving location.

DETAILED DESCRIPTION OF PREFERRED EMBODIMENTS

1. First Embodiment

A first embodiment of an article transport device will be described with reference to the drawings. An article transport device 100 is for transporting articles 8 from a receiving location 10 to a delivery location 20. This article transport device 100 can be applied to, for example, an article transport facility F for transporting and storing semiconductor wafers, reticles, or the like. The following description will be given of an example in which the article transport device 100 is applied to the aforementioned article transport facility F.

1-1. Schematic Configuration of Article Transport Facility

First, a schematic configuration of the article transport facility F will be described.

Figure 1:
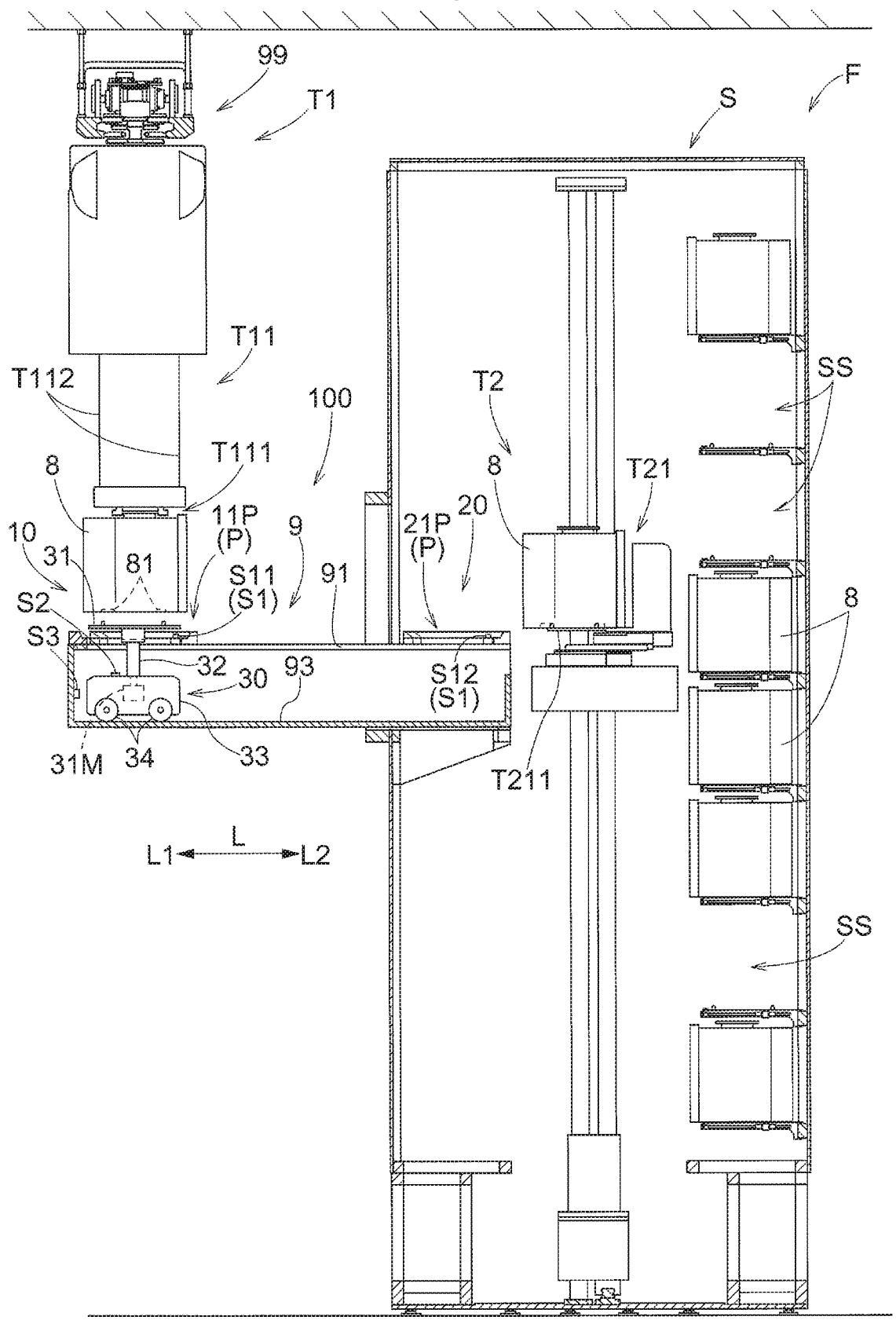
FIG. 1 is a vertical cross-sectional view of an article transport facility that is equipped with an article transport device.

As shown in FIG. 1, articles 8 are to be transported from the receiving location 10 to the delivery location 20. For example, the articles 8 are FOUPs (Front Opening Unified Pods) for accommodating semiconductor wafers. However, the articles 8 are not limited thereto, and may be, for example, any articles that are to be handled in a semiconductor manufacturing facility, such as reticle pods for accommodating reticles, or may be any articles that are not related to a semiconductor manufacturing facility.

In the example shown in FIG. 1, the article transport facility F is equipped with an article storage S for storing the articles 8. A plurality of storing portions SS for accommodating the articles 8 are provided inside the article storage S. The plurality of storing portions SS are arranged in the vertical direction or the left-right direction (horizontal direction), for example.

In this embodiment, the receiving location 10 is set outside (near the outside of) the article storage S, and the delivery location 20 is set inside the article storage S. That is to say, in this embodiment, the article transport device 100 transports the articles 8 from the outside of the article storage S where the receiving location 10 is set, to the inside of the article storage S where the delivery location 20 is set.

The article transport facility F is equipped with a ceiling transport vehicle T1 (an example of a moving body), which serves as a moving body that moves above the receiving location 10 or the delivery location 20. In this embodiment, the ceiling transport vehicle T1 moves above the receiving location 10 and travels along a ceiling rail 99, which is provided on the ceiling, while holding an article 8. The ceiling transport vehicle T1 transports the article 8 from another location within the facility to the receiving location 10 (near the outside of the article storage 5). However, the ceiling transport vehicle T1 is not limited to this configuration, and may alternatively be configured as a moving body that moves above the delivery location 20, and may receive an article 8 from the delivery location 20 and transport this article 8 to one of the storing portions SS in the article storage S.

The ceiling transport vehicle T1 is provided with a lift T11 of a suspended type. In this embodiment the lift T11 is configured as a take-in device for taking an article 8 into the receiving location 10. However if, as in the case of the aforementioned other configuration, the ceiling transport vehicle T1 is configured as a moving body that moves above the delivery location 20, the lift T11 is configured as a take-out device for taking an article out of the delivery location 20.

As shown in FIG. 1, the lift T11 has a holding portion T111 capable of holding an article 8, and a lifting belt T112 that is connected to the holding portion T111 to raise and lower the holding portion T111, and approaches the receiving location 10 from above. More specifically, the lift T11 approaches the receiving location 10 from above by letting out the lifting belt T112 in a state of holding an article 8 using the holding portion T111, and takes the article 8 into the receiving location 10. In this embodiment, the lift T11 approaches, from above, a transport placing base 31 (described later), with which a transport vehicle 30 of the article transport device 100 is provided, or a receiving-side load receiving base 11 (described later).

The article transport facility F is equipped with a stacker crane T2 (an example of a moving body), which serves as a moving body that relatively moves with respect to the receiving location 10 or the delivery location 20. In this embodiment, the stacker crane T2 is arranged inside the article storage S, and relatively moves with respect to the delivery location 20. The stacker crane T2 receives an article 8 from the delivery location 20, moves in the vertical direction and the left-right direction in a state of holding the article 8, and transports the article 8 to any of the plurality of storing portions SS arranged in the vertical direction and the left-right direction. However, the stacker crane T2 is not limited to this configuration, and may alternatively be configured as a moving body that relatively moves with respect to the receiving location 10 and transport the article 8 from a predetermined location within the facility to the receiving location 10. Note that articles 8 transported to the storing portions SS are stored, temporarily or for a long time, in these storing portions SS.

The stacker crane T2 is provided with an extension/withdrawal fork T21 capable of performing an extending/withdrawing operation. In this embodiment, the extension/ withdrawal fork T21 is configured as a take-out device for taking an article 8 out of the delivery location 20. However, if, as in the case of the aforementioned other configuration, the stacker crane T2 is configured as a moving body that relatively moves with respect to the receiving location 10, the extension/withdrawal fork T21 is configured as a take-in device for taking an article 8 into the receiving location 10.

As shown in FIG. 1, the extension/withdrawal fork T21 has a support portion T211 that performs extending and withdrawing operations and ascending and descending operations and is capable of supporting an article 8 from below, and approaches the delivery location 20 from an outer side along the horizontal direction. More specifically, the extension/withdrawal fork T21 causes the support portion T211 to project below the article 8 placed on the delivery location 20, and raises this support portion T211. Thus, the article 8 is supported from below by the support portion T211. The extension/withdrawal fork T21 then withdraws the support portion T211, thereby taking the article 8 out of the delivery location 20.

1-2. Detailed Configuration of Article Transport Device

Next, a detailed configuration of the article transport device 100 will be described.

The article transport device 100 is provided with a transport vehicle 30, which moves back and forth between the receiving location 10 and the delivery location 20, a path forming portion 9, which forms a path that connects the receiving location 10 to the delivery location 20 and through which the transport vehicle 30 moves, and a load receiving base P, which is provided at least at the receiving location 10. In this embodiment, load receiving bases P are provided at the receiving location 10 and the delivery location 20.

1-2-1. Path Forming Portion

Figure 2:
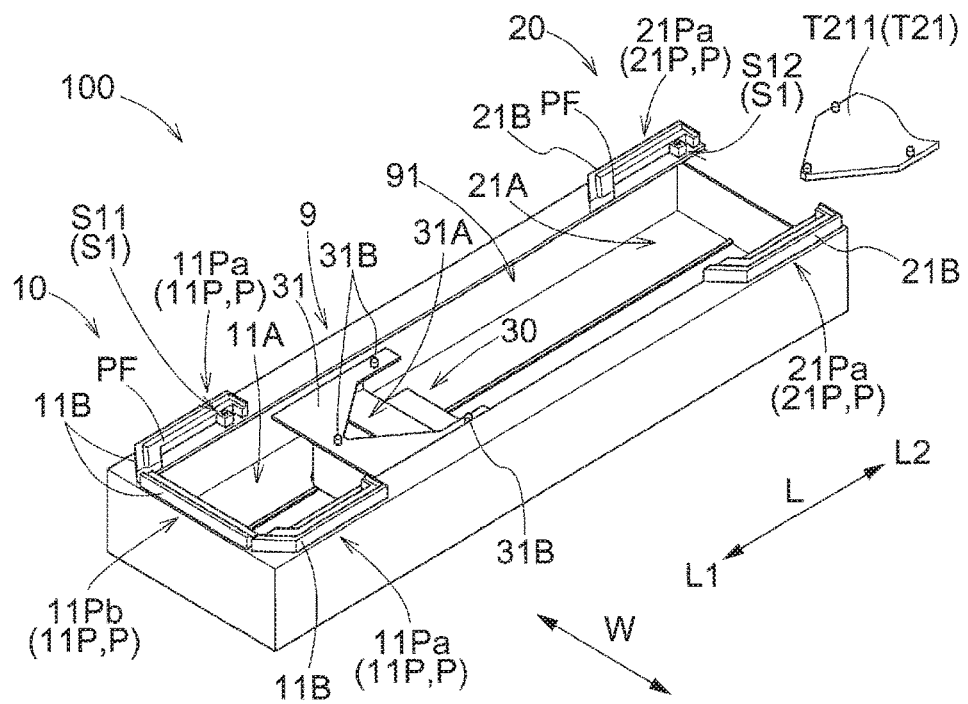
FIG. 2 is a perspective view of the article transport device.

As shown in FIGS. 1 and 2, the path forming portion 9 extends from the receiving location 10 to the delivery location 20. That is to say, the path forming portion 9 extends in a transport direction L in which the article transport device 100 transports an article 8. In the example shown in the diagrams, the path forming portion 9 is formed to have a box shape extending in the transport direction L, and an opening portion 91, which extends in the transport direction L, is formed at an upper end of the path forming portion 9. In the following description, a receiving location 10 side in the transport direction L with respect to the delivery location 20 will be referred to as a "transport-direction first side L1", and the opposite side, i.e. a delivery location 20 side with respect to the receiving location 10 will be referred to as a "transport-direction second side L2". The direction perpendicular to the transport direction L as viewed in the vertical direction will be referred to as a "transport width direction W".

The receiving location 10 and the delivery location 20 are provided in the path forming portion 9. In this embodiment, the receiving location 10 is provided at an end portion of the path forming portion 9 on the transport-direction first side L1, and the delivery location 20 is provided at an end portion of the path forming portion 9 on the transport-direction second side L2. However, the receiving location 10 and the delivery location 20 are not limited to this configuration, and at least one of the receiving location 10 and the delivery location 20 may alternatively be provided at an intermediate portion (i.e. a portion other than the end portions) of the path forming portion 9 in the transport direction L.

1-2-2. Load Receiving Base

Figure 4:
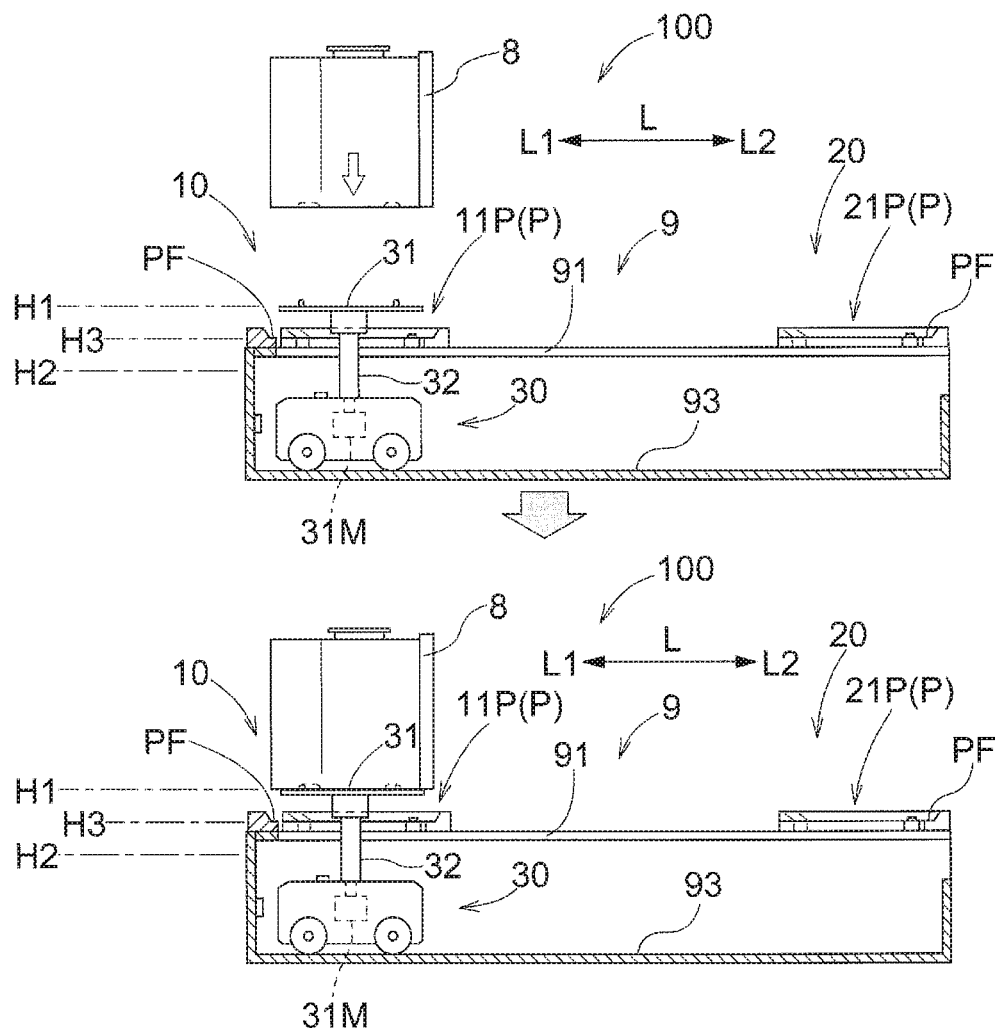
FIG. 4 illustrates an operation performed when direct transfer (receipt of an article) is performed at a receiving location.

Each of the load receiving bases P is a base on which an article 8 is to be placed, and is fixed at a predetermined third height H3 (see FIG. 4 and other diagrams). Specifically, each load receiving base P has a placement face PF on which an article 8 is to be placed, and is fixed to the path forming portion 9 such that the placement face PF is positioned at the third height H3. In this embodiment, the load receiving bases P include a receiving-side load receiving base 11P, which is provided at the receiving location 10, and a delivery-side load receiving base 21P, which is provided at the delivery location 20. Both the receiving-side load receiving base 11P and the delivery-side load receiving base 21P are fixed such that their placement faces PF are positioned at the aforementioned third height H3.

As shown in FIG. 2, in this embodiment, the receiving-side load receiving base 11P has a receiving-side opening portion 11A, which is open in the vertical direction and on the transport-direction second side L2. In the example shown in the diagrams, the receiving-side load receiving base 11P has a pair of width-direction support bases 11Pa, which are arranged separately from each other in the transport width direction W, and a transport-direction support base 11Pb, which is arranged so as to connect end portions of the pair of width-direction support bases 11Pa on the transport-direction first side L1. The receiving-side opening portion 11A is formed in a gap between the pair of width-direction support bases 11Pa in the transport width direction W. The receiving-side opening portion 11A functions as a receiving-side passage portion for the later-described transport placing base 31 of the transport vehicle 30 to pass through the receiving-side load receiving base 11P in the vertical direction.

The receiving-side load receiving base 11P is provided with receiving-side positioning portions 11B for positioning an article 8. An article 8 is positioned in a horizontal plane by the receiving-side positioning portions 11B. In this embodiment, the receiving-side positioning portions 11B are formed to be raised upward at outer edges of the receiving-side load receiving base 11P (two edges in the transport width direction W and two edges in the transport direction L in the example shown in the diagrams). In this example, the receiving-side positioning portions 11B are formed on the pair of width-direction support base 11Pa and the transport-direction support base 11Pb. Each of the receiving-side positioning portions 11B has an inclined portion that inclines downward as it extends inward. Thus, when an article 8 is placed onto the receiving-side load receiving base 11P, this article 8 can be guided to an appropriate position.

As shown in FIG. 2, in this embodiment, the delivery-side load receiving base 21P has a pair of width-direction support bases 21Pa, which are arranged separately from each other in the transport width direction W. The delivery-side load receiving base 21P has a delivery-side opening portion 21A, which is open in the vertical direction and on two sides in the transport direction L. The delivery-side opening portion 21A functions as a delivery-side passage portion for the later-described transport placing base 31 of the transport vehicle 30 to pass through the delivery-side load receiving base 21P in the vertical direction. Due to the delivery-side opening portion 21A opening on two sides in the transport direction L, an article 8 placed on the delivery-side load receiving base 21P can be lifted out from the transport-direction second side L2 by the extension/withdrawal fork T21 of the stacker crane T2. Thus, in this embodiment, the delivery-side load receiving base 21P does not interfere with the extension/withdrawal fork T21.

The delivery-side load receiving base 21P is provided with delivery-side positioning portions 21B for positioning an article 8. An article 8 is positioned in a horizontal plane by the delivery-side positioning portions 21B. In this embodiment, the delivery-side positioning portions 21B are formed to be raised upward at outer edges of the receiving-side load receiving base 21P (two edges in the transport width direction W and two edges in the transport direction L in the example shown in the diagrams). In this example, the delivery-side positioning portions 21B are formed on the pair of width-direction support bases 21Pa. Each of the delivery-side positioning portions 21B has an inclined portion that inclines downward as it extends inward. Thus, when an article 8 is placed onto the delivery-side load receiving base 21P, this article 8 can be guided to an appropriate position.

1-2-3. Transport Vehicle

The transport vehicle 30 moves back and forth between the receiving location 10 and the delivery location 20. In this embodiment, the transport vehicle 30 transports an article 8 from the receiving location 10 to the delivery location 20, and performs transport movement to move from the receiving location 10 to the delivery location 20, and restoration movement to move from the delivery location 20 to the receiving location 10. In other words, the transport vehicle 30 transports an article 8 from the outside of the article storage S to the inside thereof by performing transport movement. However, the transport vehicle 30 is not limited to the above configuration, and if the receiving location 10 is set inside the article storage S and the delivery location 20 is set outside the article storage S, the transport vehicle 30 transports an article 8 from the inside of the article storage S to the outside thereof.

The transport vehicle 30 has a transport placing base 31, on which an article 8 is to be placed, and a lift device 31M for raising and lowering the transport placing base 31 to a first height H1 (see FIG. 4 and other diagrams) and to a second height H2 (see FIG. 4 and other diagrams) that is lower than the first height H1. Here, the first height H1 is set at a position higher than the third height H3, which is the height of the aforementioned placement faces PF of the load receiving bases P, and the second height H2 is set at a position lower than the third height H3.

As shown in FIG. 2, the transport placing base 31 is formed to be smaller than the receiving-side load opening portion 11A that the receiving-side load receiving base 11P has, and the delivery-side opening portion 21A that the delivery-side load receiving base 21P has, as seen in the vertical direction. Accordingly, the transport placing base 31 can pass through the receiving-side load receiving base 11P in the vertical direction, due to the receiving-side opening portion 11A, and can pass through the delivery-side load receiving base 21P in the vertical direction, due to the delivery-side opening portion 21A.

In this embodiment, the transport placing base 31 has a cutout portion 31A, which is open in the vertical direction. In this example, the cutout portion 31A is also open on the transport-direction second side L2, and functions as a placing base passage portion for the extension/withdrawal fork T21 (take-out device) of the stacker crane T2 to pass the transport placing base 31 therethrough in the vertical direction.

In this embodiment, the transport placing base 31 includes placing base positioning portions 31B for positioning an article 8. In the example shown in the diagrams, the placing base positioning portions 31B are formed to protrude upward from an upper face of the transport placing base 31, and engage with engaging recessed portions 81 (see FIG. 1) provided in a bottom face of each article 8. As a result of the placing base positioning portions 31B engaging with the engaging recessed portions 81, an article 8 is positioned relative to the transport placing base 31. Here, each of the placing base positioning portions 31B has an engaging pin for engaging with a corresponding engaging recessed portion 81 provided in the bottom face of each article 8. In this example, the engaging recessed portions 81 are provided at three positions on the bottom face of each article 8, and the placing base positioning portions 31B are constituted by three engaging pins that are arranged at three positions corresponding to the engaging recessed portions 81.

In this embodiment, the transport vehicle 30 has a vehicle body 33, a plurality of (four in this embodiment) wheels 34, which are supported by the vehicle body 33, and a support shaft portion 32 (see FIG. 1), which extends upward from the vehicle body 33 and supports the transport placing base 31. The transport vehicle 30 moves along the path forming portion 9 as a result of the plurality of wheels 34 rolling on a bottom portion 93 of the path forming portion 9. In this example, the transport vehicle 30 includes a traveling device 34M (see FIG. 3) for applying driving force acting in the transport direction to the wheels 34. The traveling device 34M drives at least one of the plurality of wheels 34. The transport vehicle 30 can travel along the path forming portion 9 by being driven by the traveling device 34M.

Figure 5:
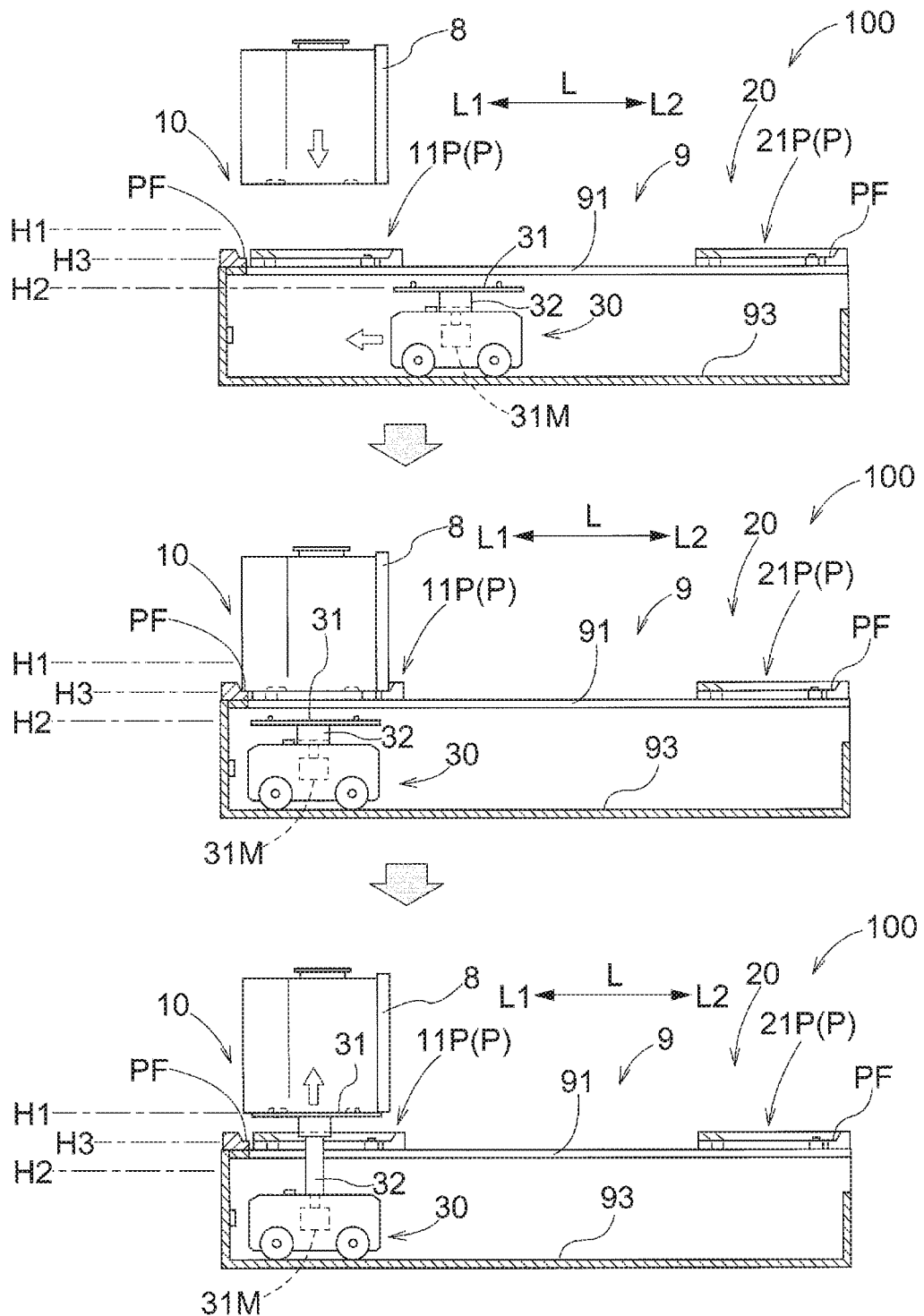
FIG. 5 illustrates an operation performed when load receiving base transfer (receipt of an article) is performed at the receiving location.
Figure 7:
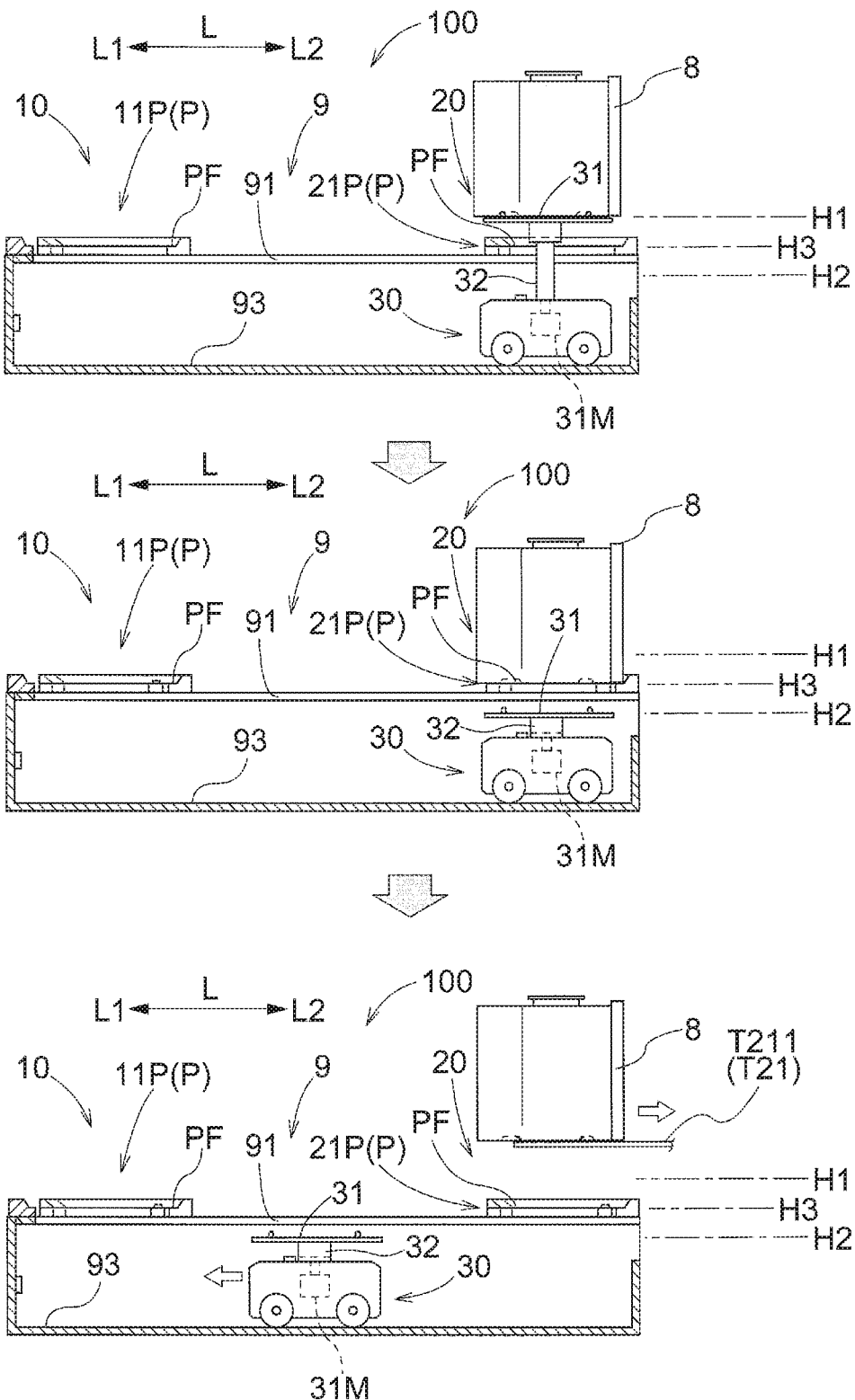
FIG. 7 illustrates an operation performed when load receiving base transfer (receipt of an article) is performed at the delivery location.

The support shaft portion 32 can extend and contract in the vertical direction, and supports the transport placing base 31 at its upper end portion. The aforementioned lift device 31M drives the support shaft portion 32 in an extending and contracting manner. Thus, the lift device 31M can raise and lower the transport placing base 31 supported at the upper end portion of the support shaft portion 32. For example, as shown in FIGS. 5 and 7, the lift device 31M raises and lowers the transport placing base 31 between the first height H1 and the second height H2. The transport placing base 31 is formed to be smaller than the opening portion 91 provided in the path forming portion 9, as seen in the vertical direction. The transport placing base 31 is positioned, when at the first height H1, out of (above) the box-shaped path forming portion 9, and is positioned, when at the second height H2, within the box-shaped path forming portion 9. The aforementioned load receiving bases P are fixed at the third height 113, which is between the first height H1 and the second height H2, within the path forming portion 9. Note that, in addition to the above-described configuration, the support shaft portion 32 may also turn the transport placing base 31, in accordance with the purpose of transfer of articles 8 at the receiving location 10 and the delivery location 20, by rotating around an axis extending in the vertical direction.

1-2-4. Detection Unit

The article transport device 100 includes an article detection unit S1 for detecting whether or not an article 8 is present at the receiving location 10 and the delivery location 20, a height detection unit S2 for detecting the height of the transport placing base 31, and a position detecting unit S3 for detecting the position of the transport vehicle 30 in the transport direction L.

In this embodiment, the article detection unit S1 is configured as a contact sensor that detects that an article is present, due to the article 8 coming into contact therewith. However, the article detection unit S1 is not limited to this configuration, and may alternatively be configured as, for example, an optical sensor that detects whether or not an article 8 is present, based on a light beam being interrupted.

The article detection unit S1 has a receiving-side article detection unit S11 for detecting whether or not an article 8 is present at the receiving location 10, and a delivery-side article detection unit S12 for detecting whether or not an article 8 is present at the delivery location 20. In the example shown in the diagrams, the receiving-side article detection unit S11 is arranged at a contact portion (near the placement face PF) of the receiving-side load receiving base 11P that comes into contact with an article 8. The delivery-side article detection unit S12 is arranged at a contact portion (near the placement face PF) of the delivery-side load receiving base 21P that comes into contact with an article 8.

The height detection unit S2 is configured as an optical sensor that detects the height of the transport placing base 31 based on reflection of a light beam applied to the transport placing base 31. In the example shown in FIG. 1, the height detection portion S2 is provided at an upper portion of the vehicle body 33, and applies a light beam to the transport placing base 31 that is located above the height detection unit 31. The height detection unit S2 detects the distance to the transport placing base 31, i.e. the height of the transport placing base 31 by receiving reflected light from the transport placing base 31. However, the height detection unit S2 is not limited to this configuration. For example, the height detection unit S2 may alternatively detect the height of the transport placing base 31 based on the amount of operation (amount of extension/withdrawal) of the support shaft portion 32, or may detect whether or not the transport placing base 31 is present at the first height H1 and the second height H2, using an optical sensor, a contact sensor, or the like.

The position detecting unit S3 is configured as an optical sensor that detects the position of the transport vehicle 30 in the transport direction L, based on reflection of a light beam applied to the vehicle body 33. In the example shown in FIG. 1, the position detecting unit S3 is provided at an end portion of the path forming portion 9 on the transport-direction first side L1, and applies a light beam toward the transport-direction second side L2. The position detecting unit S3 detects the distance to the transport vehicle 30, i.e. the position of the transport vehicle 30 in the transport direction L by receiving reflected light from the transport vehicle 30 that travels in the transport direction L. However, the position detecting unit S3 is not limited to this configuration. The position detecting unit S3 may alternatively be provided in the transport vehicle 30, and detect the current position of the transport vehicle 30 in the transport direction L based on the amount of rotation of the wheels 34 or the like, or may detect whether or not the transport vehicle 30 at each position in the transport direction L using an optical sensor, a contact sensor, or the like.

1-2-5. Control Configuration of Article Transport Facility

Next, a control configuration of the article transport facility F will be described.

Figure 3:
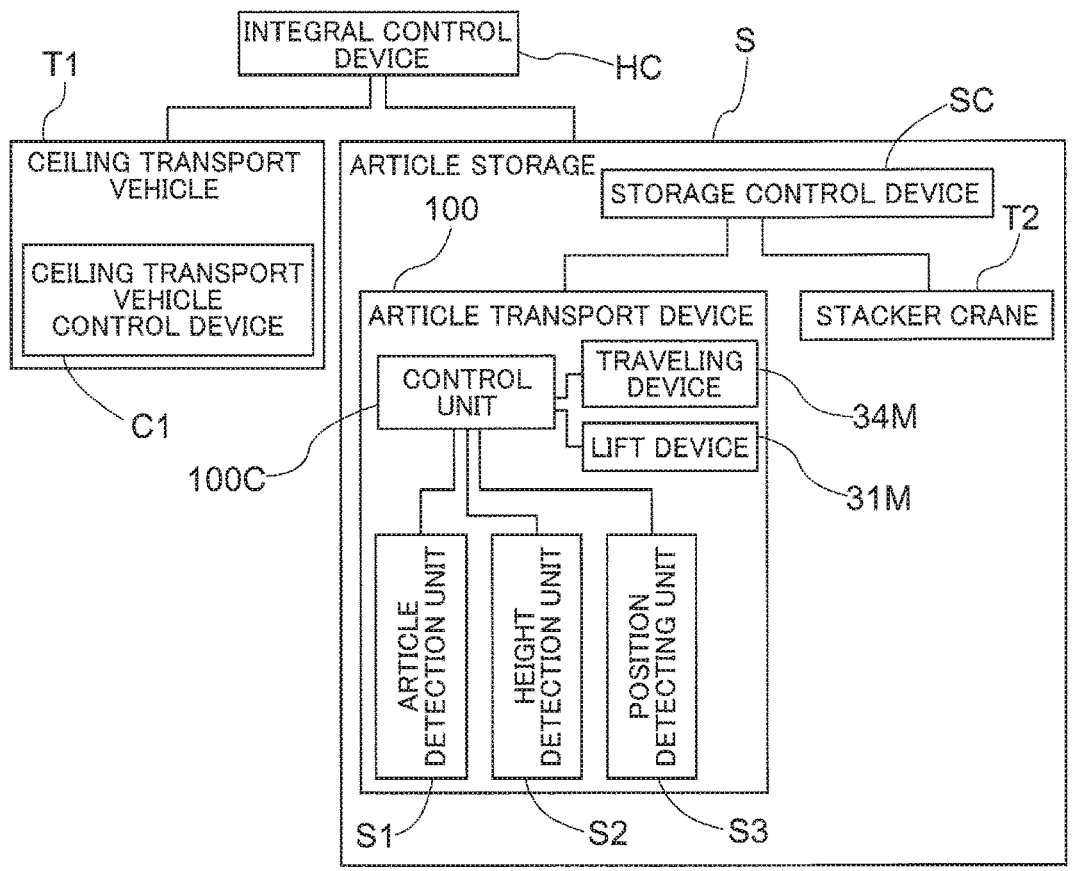
FIG. 3 is a control block diagram of the article transport facility.

As shown in FIG. 3, the article transport facility F includes an integral control device HC for integrally controlling the entire facility, a ceiling transport vehicle control device C1 for controlling operations of the ceiling transport vehicle T1, and a storage control device SC for controlling operations of the article storage S, including operations of the article transport device 100 and operations of the stacker crane T2. Articles 8 are transported between the article storage S and various locations within the facility, as a result of the integral control device HC, the ceiling transport vehicle control device C1, and the storage control device SC cooperating with each other. The integral control device HC is provided at a position in the article transport facility F. In the example shown in the diagrams, the ceiling transport vehicle control device C1 is provided in the ceiling transport vehicle T1. The storage control device SC is provided in the article storage S. Each of these control devices includes a processor, such as a microcomputer, peripheral circuits, such as a memory, and so on, for example. Functionalities are realized as a result of the aforementioned hardware and programs executed on the processor, such as a computer, working together.

In this embodiment, the article transport device 100 includes a control unit 100C for controlling operations of the traveling device 34M and operations of the lift device 31M. In this example, the control unit 100C acquires, from the article detection unit S1, information regarding whether or not an article 8 is present at the receiving location 10 and the delivery location 20, acquires, from the height detection unit S2, information regarding the height of the transport placing base 31, and acquires, from the position detecting unit S3, information regarding the current position of the transport vehicle 30 in the transport direction L.

1-2-6. Receipt of Article by Transport Vehicle

Next, receipt of an article 8 by the transport vehicle 30 will be described with reference to FIGS. 4 and 5. FIGS. 4 and 5 illustrate operations of the transport vehicle 30 at the receiving location 10, or more specifically, operations of the lift device 31M (transport placing base 31) at the receiving location 10.

The transport vehicle 30 receives, at the receiving location 10, an article 8 as a result of the article 8 being placed onto the transport placing base 31 positioned at the first height H1 (see FIG. 4), or by raising the transport placing base 31 from the second height H2 to the first height H1 with the article 8 placed on the receiving-side load receiving base 11P, and then the article 8 being placed onto the transport placing base 31 (see FIG. 5). Thus, there are at least two manners of the operation of receipt of an article 8 by the transport vehicle 30. The details will be described below.

As shown in FIG. 4, if no article 8 is placed on the receiving-side load receiving base 11P, and the transport vehicle 30 is in a state of being able to wait at the receiving location 10, the lift device 31M sets the height of the transport placing base 31 to the first height H1 that is higher than the third height H3, which is the height at which the receiving-side load receiving base 11P is fixed. Then, an article 8 that has been transported by the ceiling transport vehicle T1 (see FIG. 1) is directly placed onto the transport placing base 31 positioned at the first height H1. Thus, the article 8 is received by the transport vehicle 30. In the following description, this type of transfer of an article 8 performed not via the load receiving base P will be referred to as a "direct transfer".

On the other hand, as shown in FIG. 5, if an article 8 has been placed immediately previously, or has already been placed, onto the receiving-side load receiving base 11P, and the transport vehicle 30 is in a state of being unable to wait at the receiving location 10, the lift device 31M sets the height of the transport placing base 31 to the second height H2 that is lower than the third height H3, at which the receiving-side load receiving base 11P is fixed. An article 8 that has been transported by the ceiling transport vehicle T1 is placed onto the receiving-side load receiving base 11P before the transport vehicle 30 arrives at the receiving location 10, or simultaneously with the arrival of the transport vehicle 30 at the receiving location 10. Then, as a result of the lift device 31M raising the transport placing base 31 from the second height H2 to the first height H1, the article 8 placed on the receiving-side load receiving base 11P is transferred to (i.e. placed onto) the transport placing base 31. Thus, the article 30 is received by the transport vehicle 8. In the following description, this type of transfer of an article 8 performed via the load receiving base P will be referred to as a "load receiving base transfer".

1-2-7. Delivery of Article by Transport Vehicle

Figure 6:
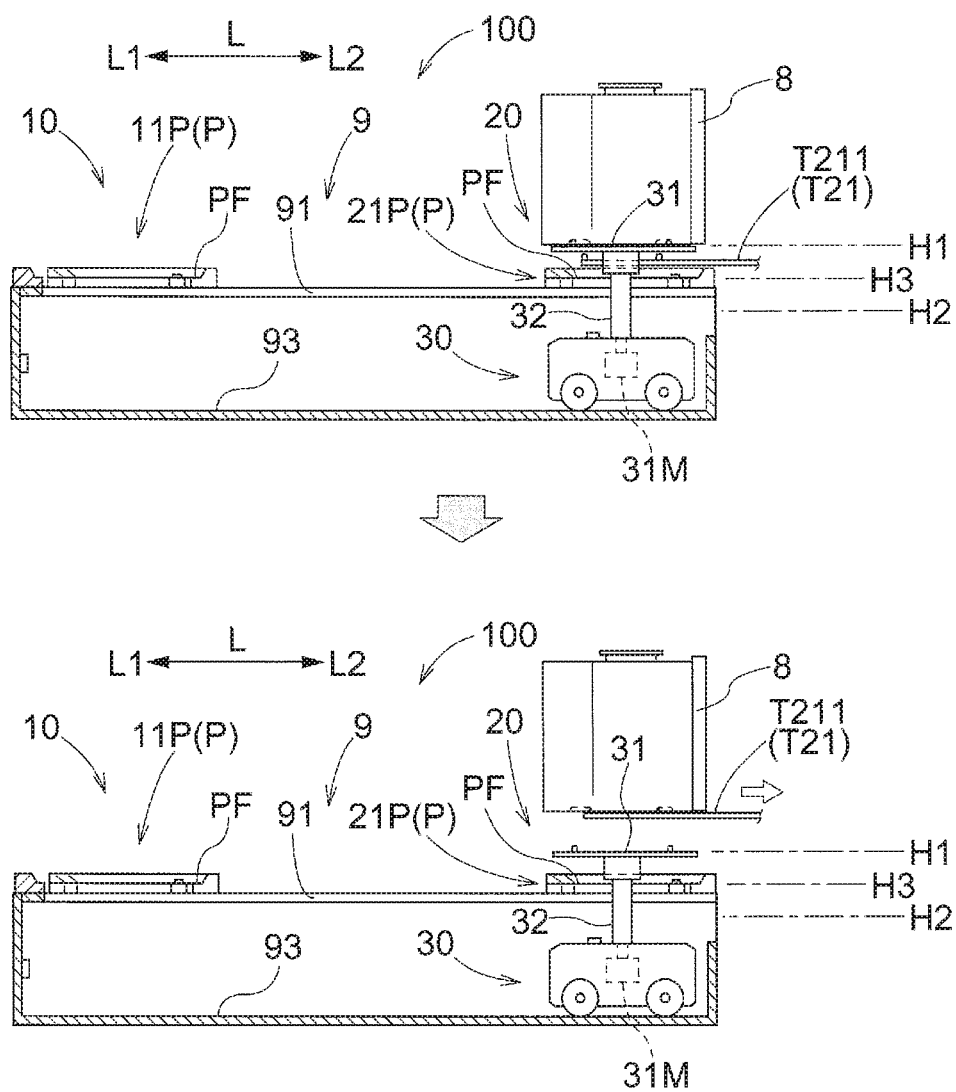
FIG. 6 illustrates an operation performed when direct transfer (receipt of an article) is performed at a delivery location.

Next, delivery of an article 8 by the transport vehicle 30 will be described with reference to FIGS. 6 and 7. FIGS. 6 and 7 illustrate operations of the transport vehicle 30 at the delivery location 20, or more specifically, operations of the lift device 31M (transport placing base 31) at the delivery location 20.

The transport vehicle 30 delivers an article 8 at the delivery location 20 as a result of the article 8 being picked up from the transport placing base 31 positioned at the first height H1 (see FIG. 6), or by lowering the transport placing base 31 from the first height H1 to the second height H2 with the article 8 placed on the transport placing base 31, to place the article 8 onto the delivery-side load receiving base 21P (see FIG. 7). Thus, there are at least two manners of the operation of the delivery of an article 8 by the transport vehicle 30. The details will be described below.

As shown in FIG. 6, if the extension/withdrawal fork T21 (take-out device) of the stacker crane T2 is in a state of being capable of a transfer (i.e. a state of being ready for a transfer) at the delivery location 20, or in a state immediately before entering the state of being capable of transfer, the lift device 31M sets the height of the transport placing base 31 to the first height H1 that is higher than the third height H3, at which the delivery-side load receiving base 21P is fixed. Then, the article 8 is picked up from the transport placing base 31 as a result of the extension/withdrawal fork T21 lifting out the article 8 placed on the transport placing base 31 positioned at the first height H1. Thus, the article 8 is delivered by the transport vehicle 30. The delivery of the article 8 in this case is a transfer performed not via the load receiving base P, and therefore corresponds to direct transfer.

On the other hand, as shown in FIG. 7, if the extension/withdrawal fork T21 (take-out device) of the stacker crane T2 is in a state of being not capable of a transfer (i.e. a state of being not ready for a transfer) at the delivery location 20, the lift device 31M sets the height of the transport placing base 31 from the first height H1 to the second height H2 that is lower than the third height H3, at which the delivery-side load receiving base 21P is fixed, after the transport vehicle 30 arrives at the delivery location 20. That is to say, as a result of the lift device 31M lowering the transport placing base 31 from the first height H1 to the second height H2, the article 8 that has been placed on the transport placing base 31 is transferred to (placed onto) the delivery-side load receiving base 21P. Thus, the article 8 is delivered by the transport vehicle 30. The delivery of the article 8 in this case is a transfer performed via the load receiving base P, and therefore corresponds to load receiving base transfer. Note that, as shown in FIG. 7, the article 8 subjected to load receiving base transfer at the delivery location 20 is lifted out by the extension/withdrawal fork T21 of the stacker crane T2, and is transferred to the inside of the article storage S (see FIG. 1).

1-2-8. Operations of Lift Device (Transport Placing Base) Accompanying Transport Movement Next, operations of the lift device 31M (transport placing base 31) accompanying transport movement of the transport vehicle 30 will be described with reference to FIG. 8. FIG. 8 is a schematic table of operations of the lift device 31M (transport placing base 31) performed when the transport vehicle 30 performs transport movement, classifying the operations in accordance with the type of transfer (direct transfer or load receiving base transfer) performed at the receiving location 10 and the delivery location 20. Note that, as mentioned above, transport movement refers to movement of the transport vehicle 30 from the receiving location 10 to the delivery location 20.

The lift device 31M performs different transfer operations when the transport vehicle 30 performs transport movement to move from the receiving location 10 to the delivery location 20, in accordance with whether or not the extension/withdrawal fork T21 (take-out device) is in a state of being capable of transfer at the delivery location 20. Whether or not the extension/withdrawal fork T2 is in a state of being capable of transfer is determined by the control unit 100C (see FIG. 3) of the article transport device 100. Specifically, as shown in FIG. 3, the control unit 100C acquires, via the storage control device SC, information regarding the current position, the operational state, and the like of the stacker crane T2, and determines, based on the acquired information, whether or not the extension/withdrawal fork T21 is in a state of being capable of transfer (a state of being ready for transfer) or a state immediately before entering the state of being capable of transfer, at the delivery location 20.

Specifically, as shown in the first and third sections in FIG. 8, if the extension/withdrawal fork T21 is in a state of being capable of transfer (a state of being ready for transfer) at the delivery location 20, the lift device 31M performs a transfer operation so as to keep the transport placing base 31 at the first height H1 after the transport vehicle 30 has arrived at the delivery location 20, until the article 8 placed on the transport placing base 31 is transferred (lifted out) by the extension/withdrawal fork T21. As mentioned above, direct transfer is performed as a result of the article 8 placed on the transport placing base 31 being transferred (lifted out) by the extension/withdrawal fork T21.

Also, as shown in the second and fourth sections in FIG. 8, if the extension/withdrawal fork T21 is in a state of being not capable of transfer (a state of being not ready for transfer) at the delivery location 20, the lift device 31M performs a transfer operation so as to lower the transport placing base 31 from the first height H1 to the second height H2 after the transport vehicle 30 has arrived at the delivery location 20. Thus, the article 8 placed on the transport placing base 31 is transferred to the delivery-side load receiving base 21P, and thus, load receiving base transfer is performed.

Note that, as already described with reference to FIGS. 4 and 5, the lift device 31M performs different transfer operations before the transport vehicle 30 starts transport movement, depending on whether direct transfer or load receiving base transfer is performed at the receiving location 10. That is to say, as shown in the first and second sections in FIG. 8, if direct transfer is performed at the receiving location 10, the lift device 31M receives an article 8 while keeping the transport placing base 31 at the first height H1. Thereafter, the transport vehicle 30 performs transport movement, while the lift device 31M keeps the height of the transport placing base 31 at the first height H1. On the other hand, as shown in the third and fourth sections in FIG. 8, if load receiving base transfer is performed at the receiving location 10, the lift device 31M raises the transport placing base 31 from the second height H2 to the first height H1 to receive an article 8 on the transport placing base 31 from the receiving-side load receiving base 11P. Thereafter, the transport vehicle 30 performs transport movement, while the lift device 31M keeps the height of the transport placing base 31 at the first height H1.

1-2-9. Operations of Lift Device (Transport Placing Base) Accompanying Restoration Movement Next, operations of the lift device 31M (transport placing base 31) accompanying restoration movement of the transport vehicle 30 will be described with reference to FIG. 9. FIG. 9 is a schematic table of operations of the lift device 31M (transport placing base 31) performed when the transport vehicle 30 performs restoration movement, classifying the operations in accordance with the type of transfer performed at the delivery location 20 and whether or not an article 8 is present at the receiving location 10. Note that, as mentioned above, restoration movement refers to movement of the transport vehicle 30 from the delivery location 20 to the receiving location 10.

The lift device 31M performs different restoration operations when the transport vehicle 30 performs restoration movement to move from the delivery location 20 to the receiving location 10, in accordance with the height of the transport placing base 31 after an article 8 has been delivered at the delivery location 20, and whether or not the article 8 is present on the receiving-side load receiving base 11P at the receiving location 10.

The height of the transport placing base 31 after an article 8 has been delivered at the delivery location 20 and whether or not an article 8 is present on the receiving-side load receiving base 11P is determined by the control unit 100C (see FIG. 3) of the article transport device 100.

Specifically, as shown in FIG. 3, the control unit 100C acquires, from the height detection unit S2, information regarding the height of the transport placing base 31, and determines, based on the acquired information, whether the height of the transport placing base 31 after an article 8 has been delivered at the delivery location 20 is the first height H1 or the second height H2. Note that, as shown in FIG. 9, the transport placing base 31 is positioned at the first height H1 after direct transfer has been performed at the delivery location 20, and the transport placing base 31 is positioned at the second height H2 after load receiving base transfer has been performed at the delivery location 20. Accordingly, the determination is not limited to the above configuration, and the height of the transport placing base 31 after an article 8 has been delivered at the delivery location 20 may alternatively be determined based on the type of transfer (direct transfer or load receiving base transfer) performed at the delivery location 20.

The control unit 100C also acquires information regarding whether or not an article 8 is present, from the article detection unit S1 (receiving-side article detection unit S11: see FIG. 1 and other diagrams), and determines, based on the acquired information, whether or not an article 8 is present on the receiving-side load receiving base 11P. However, the determination is not limited to this configuration. For example, as shown in FIG. 3, the control unit 100C may acquire information regarding the current position, the operational state, and the like of the ceiling transport vehicle control device T1 via the ceiling transport vehicle control device C1, the integral control device HC, and the storage control device SC, and determine, based on the acquired information, whether or not an article 8 is present on the receiving-side load receiving base 11P. In this case, if an article 8 is about to be placed onto the receiving-side load receiving base 11P soon by the ceiling transport vehicle T1, it may be determined that an article is present on the receiving-side load receiving base 11P.

As shown in the first and third sections in FIG. 9, if no article 8 is present on the receiving-side load receiving base 11P, the lift device 31M performs a restoration operation so as to set the transport placing base 31 to the first height H1 before the transport vehicle 30 arrives at the receiving location 10. Also, as shown in the second and fourth sections in FIG. 9, if an article 8 is present on the receiving-side load receiving base 11P, the lift device 31M performs a restoration operation so as to set the transport placing base 31 at the second height H2 before the transport vehicle 30 arrives at the receiving location 10.

As shown in the first and fourth sections in FIG. 9, if the height of the transport placing base 31 after an article 8 has been delivered at the delivery location 20 is the same as the height (target height) of the transport placing base 31 after the restoration operation has been completed, the lift device 31M keeps the height of the transport placing base 31 during restoration movement of the transport vehicle 30. For example, as shown in the first section in FIG. 9, if the height of the transport placing base 31 after transfer at the delivery location 20 has been completed is the first height H1, and the target height of the transport placing base 31 when being restored to the receiving location 10 is also the first height H1, the lift device 31M keeps the height of the transport placing base 31 during restoration movement of the transport vehicle 30 at the first height H1. Also, as shown in the fourth section in FIG. 9, if the height of the transport placing base 31 after transfer at the delivery location 20 has been completed is the second height H2, and the target height of the transport placing base 31 when being restored to the receiving location 10 is also the second height H2, the lift device 31M keeps the height of the transport placing base 31 during restoration movement of the transport vehicle 30 to the second height H2.

On the other hand, as shown in the second and third sections in FIG. 9, if the height of the transport placing base 31 after an article 8 has been delivered at the delivery location 20 differs from the height (target height) of the transport placing base 31 after a restoration operation has been completed, the lift device 31M changes the height of the transport placing base 31 during restoration movement of the transport vehicle 30. For example, as shown in the second section in FIG. 2, if the height of the transport placing base 31 after transfer at the delivery location 20 has been completed is the first height H1, and the target height of the transport placing base 31 when being restored to the receiving location 10 is the second height H2, the lift device 31M lowers the height of the transport placing base 31 during restoration movement of the transport vehicle 30 from the first height H1 to the second height H2. Also, as shown in the third section in FIG. 9, if the height of the transport placing base 31 after transfer at the delivery location 20 has been completed is the second height H2, and the target height of the transport placing base 31 when being restored to the receiving location 10 is the first height H1, the lift device 31M raises the height of the transport placing base 31 during restoration movement of the transport vehicle 30 from the second height H2 to the first height H1.

Also, in this embodiment, in the case of changing the height of the transport placing base 31 during restoration movement of the transport vehicle 30, the lift device 31M gradually raises or lowers the transport placing base 31 in accordance with the movement of the transport vehicle 30, as shown in the second and third sections in FIG. 9. Thus, the lift device 31M performs a so-called smoothing operation to lift and lower the transport placing base 31 in parallel with movement of the transport vehicle 30. More specifically, a second height keeping zone A2 is provided in an area on the second height H2 side at a fixed distance from the receiving location 10 and the delivery location 20 in order to avoid interference with an article 8 placed on the receiving-side load receiving base 11P at the receiving location 10 and to avoid interference with an article 8 placed on the delivery-side load receiving base 21P at the delivery location 20. The lift device 31M then keeps the height of the transport placing base 31 at the second height H2 in the second height keeping zone A2, and performs the smoothing operation in an area other than the second height keeping zone A2. Note that, in this example, a first height keeping zone A1 is also provided similarly in an area on the first height H1 side at a fixed distance from the receiving location 10 and the delivery location 20. The lift device 31M keeps the height of the transport placing base 31 at the first height H1 in the first height keeping zone A1. That is to say, the lift device 31M performs the smoothing operation in an intermediate zone A3 that is a zone other than the first height keeping zone A1 and the second height keeping zone A2.

As described above, in this embodiment, the lift device 31M performs one of first to fourth restoration operations in accordance with the height of the transport placing base 31 after an article 8 has been delivered at the delivery location 20, and whether or not an article 8 is present on the receiving-side load receiving base 11P at the receiving location 10. Specifically, if the height of the transport placing base 31 after an article 8 has been delivered at the delivery location 20 is the first height H1, and no article 8 is present on the receiving-side load receiving base 11P, the lift device 31M performs the first restoration operation to keep the height of the transport placing base 31 at the first height H1 during restoration movement of the transport vehicle 30, as shown in the first section in FIG. 9. If the height of the transport placing base 31 after an article 8 has been delivered at the delivery location 20 is the first height H1, and an article 8 is present on the receiving-side load receiving base 11P, the lift device 31M performs the second restoration operation to lower the height of the transport placing base 31 from the first height H1 to the second height H2 during restoration movement of the transport vehicle 30, as shown in the second section in FIG. 9. If the height of the transport placing base 31 after an article 8 has been delivered at the delivery location 20 is the second height H2, and no article 8 is present on the receiving-side load receiving base 11P, the lift device 31M performs the third restoration operation to raise the height of the transport placing base 31 from the second height H2 to the first height H1 during restoration movement of the transport vehicle 30, as shown in the third section in FIG. 9. Furthermore, if the height of the transport placing base 31 after an article 8 has been delivered at the delivery location 20 is the second height H2, and an article 8 is present on the receiving-side load receiving base 11P, the lift device 31M performs the fourth restoration operation to keep the height of the transport placing base 31 at the second height H2 during restoration movement of the transport vehicle 30, as shown in the fourth section in FIG. 9.

As described above, FIG. 8 illustrates four patterns of the operations of the lift device 31M (transport placing base 31) accompanying transport movement of the transport vehicle 30, and FIG. 9 illustrates four patterns of the operations of the lift device 31M (transport placing base 31) accompanying restoration movement of the transport vehicle 30. The article transport device 100 can perform the four operation patterns shown in FIG. 8 and the four operation patterns shown in FIG. 9 while combining these patterns as much as possible.

1-2-10. Operation Procedure of Article Transport Device

Figure 10:
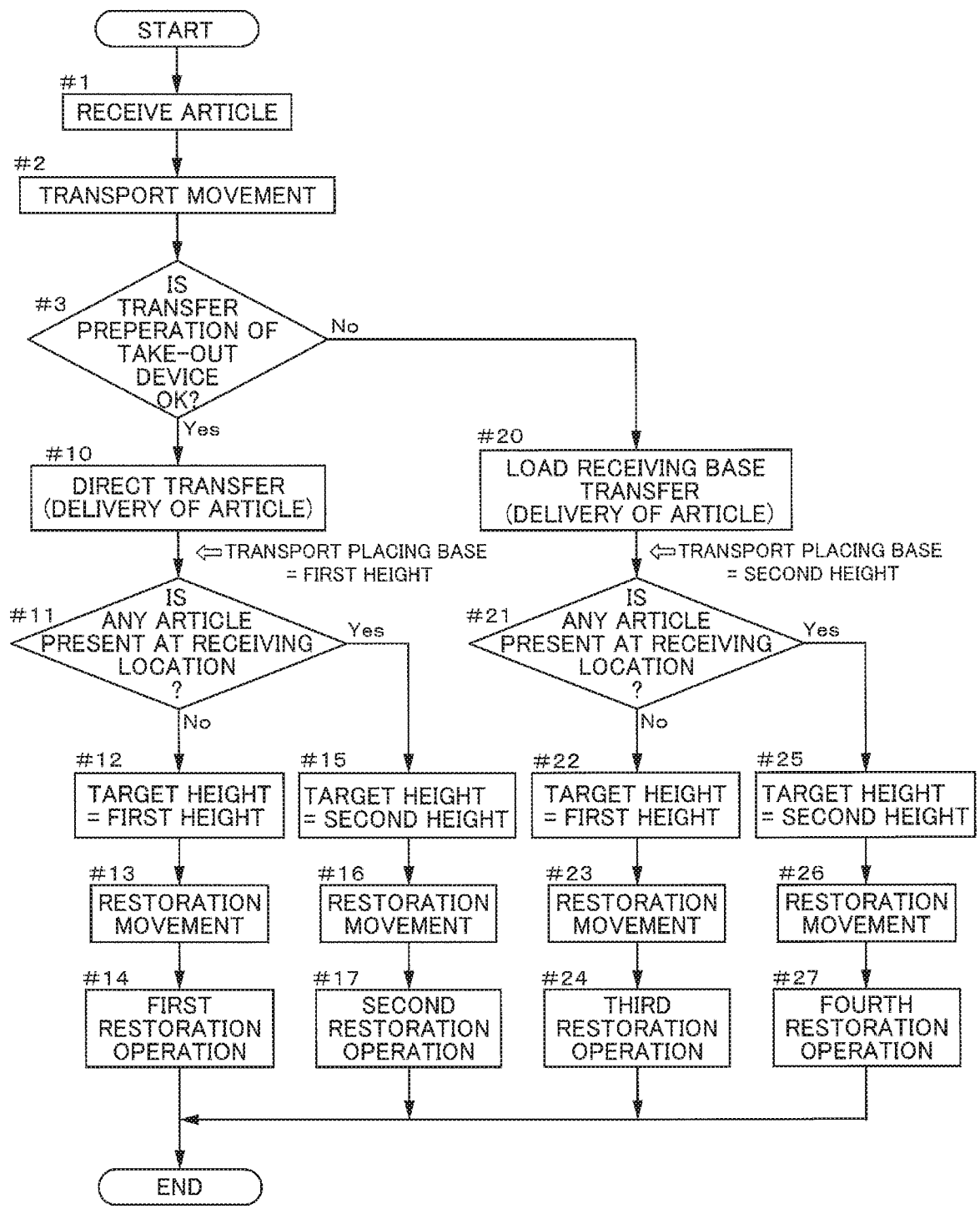
FIG. 10 is a flowchart illustrating an operation procedure of the article transport device.

Next, an operation procedure of the article transport device 100 will be described with reference to FIG. 10 (and also FIG. 1 as needed).

The article transport device 100 operates in accordance with the following procedure. Initially, an article 8 is received at the receiving location 10 (#1). The article 8 is received through direct transfer, i.e. the transport placing base 31 receives the article 8 from the ceiling transport vehicle T1, or through load receiving base transfer, i.e. the transport placing base 31 receives the article 8 from the receiving-side load receiving base 11P. After the article 8 is received, transport movement is performed (#2). Thus, the article 8 is transported to the delivery location 20.

Next, it is determined whether or not the take-out device (extension/withdrawal fork T21) has completed transfer preparation at the delivery location 20 (#3). If it is determined that transfer preparation has been completed (#3: Yes), the article 8 is delivered through direct transfer (#10). If it is determined that transfer preparation has not been completed (#3: No), the article 8 is delivered through load receiving base transfer (#20).

If the article 8 is delivered through direct transfer (#10), the article 8 is directly transferred Gifted out) from the transport placing base 31 positioned at the first height H1 by the take-out device (extension/withdrawal fork T21) as described above, and accordingly, the height of the transport placing base 1 is kept at the first height H1.

After the article 8 has been delivered through direct transfer (#10), it is determined whether or not an article 8 is present at the receiving location 10 (receiving-side load receiving base 11P) (#11). If it is determined that no article 8 is present at the receiving location 10 (#11: No), the target height, namely the height of the transport placing base 31 after a restoration operation has been completed is set to the first height H1 (#12). Thereafter, restoration movement of the transport vehicle 30 is performed (#13), and the first restoration operation to keep the height of the transport placing base 31 during restoration movement at the first height H1 is performed by the lift device 31M (#14). Thus, the article transport device 100 enters a state of positioning the transport placing base 31 at the first height H1 at the receiving location 10. If, then, the next article 8 is received from the ceiling transport vehicle T1 (#1), the article transport device 100 transports this article 8 (#2).

If, in step 11, it is determined that an article 8 is present at the receiving location 10 (#11: Yes), the target height, namely the height of the transport placing base 31 after completing the restoration operation is set to the second height H2 (#15). Thereafter, restoration movement of the transport vehicle 30 is performed (#16), and the second restoration operation to lower the height of the transport placing base 31 from the first height H1 to the second height H2 is performed by the lift device 31M during restoration movement (#17). Thus, the article transport device 100 enters a state of positioning the transport placing base 31 at the second height H2 at the receiving location 10. Thereafter, the article transport device 100 raises the transport placing base 31 from the second height H2 to the first height H1 to receive the next article 8 (#1), and transports this article 8 (#2).

If, in step 20, the article 8 is delivered through load receiving base transfer (#20), the article 8 is transferred to the delivery-side load receiving base 21P as a result of the transport placing base 31 being lowered from the first height H1 to the second height H2, as mentioned above, and thus, the height of the transport placing base 31 has been changed to the second height H2.

After the article 8 has been delivered through load receiving base transfer (#20), it is determined whether or not an article 8 is present at the receiving location 10 (receiving-side load receiving base 11P) (#21). If it is determined that no article 8 is present at the receiving location 10 (#21: No), the target height, namely the height of the transport placing base 31 after the restoration operation has been completed is set to the first height H1 (#22). Thereafter, restoration movement of the transport vehicle 30 is performed (#23), and the third restoration operation to raise the height of the transport placing base 31 from the second height H2 to the first height H1 is performed during restoration movement by the lift device 31M (#24). Thus, the article transport device 100 enters a state of positioning the transport placing base 31 at the first height H1 at the receiving location 10. If, then, the next article 8 is received from the ceiling transport vehicle T1 (#1), the article transport device 100 transports this article 8 (#2).

If, in step 21, it is determined that an article 8 is present at the receiving location 10 (#21: Yes), the target height, namely the height of the transport placing base 31 after the restoration operation has been completed is set to the second height H2 (#25). Thereafter, restoration movement of the transport vehicle 30 is performed (#26), and the fourth restoration operation to keep the height of the transport placing base 31 during restoration movement at the second height H2 is performed by the lift device 31M (#27). Thus, the article transport device 100 enters a state of positioning the transport placing base 31 at the second height H2 at the receiving location 10. Thereafter, the article transport device 100 raises the transport placing base 31 from the second height H2 to the first height H1 to receive the next article 8 (#1), and transports this article 8 (#2).

2. Other Embodiments

Next, other embodiments of the article transport device will be described.

(1) The above embodiment has described an example in which the ceiling transport vehicle T1 is provided on the receiving location 10 side of the article transport device 100, and the stacker crane T2 is provided on the delivery location 20 side. However, the present invention is not limited to this configuration, and the stacker crane T2 may alternatively be provided on the receiving location 10 side of the article transport device 100, and the ceiling transport vehicle T1 may be provided on the delivery location 20 side. Alternatively, the ceiling transport vehicle T1 may be provided on both the receiving location 10 side and the delivery location 20 side of the article transport device 100. Also, the stacker crane T2 may be provided on both the receiving location 10 side and the delivery location 20 side of the article transport device 100.

(2) The above embodiment has described an example in which the receiving location 10 is set outside the article storage S, and the delivery location 20 is set inside the article storage S. However, the present invention is not limited to this example, and the delivery location 20 may alternatively be set outside the article storage S, and the receiving location 10 may be set inside the article storage S. That is to say, the above embodiment has described an example in which articles 8 are transported from the outside of the article storage S (receiving location 10) to the inside thereof (delivery location 20) by the article transport device 100, but the article transport device 100 may alternatively transfer articles 8 from the inside of the article storage S (receiving location 10) to the outside thereof (delivery location 20). A configuration is also preferable in which one article storage S is provided with an article transport device 100 that transports articles 8 from the outside of the article storage S to the inside thereof, and an article transport device 100 that transports articles 8 from the inside of the article storage S to the outside thereof.

(3) The above embodiment has described an example in which articles 8 are taken into the receiving location 10 and taken out of the delivery location 20 by devices such as the ceiling transport vehicle T1, the stacker crane T2, or the like. However, the present invention is not limited to this configuration, and the take-in device and the take-out device may be constituted by devices other than these devices. Alternatively, articles 8 may be taken in and out by an operator, without using devices.

(4) The above embodiment has described an example in which, when changing the height of the transport placing base 31 during restoration movement of the transport vehicle 30, the lift device 31M gradually raises or lowers the transport placing base 31 in accordance with the movement of the transport vehicle 30. However, the present invention is not limited to this example, and the lift device 31M may raise or lower the transport placing base 31 independently from the movement of the transport vehicle 30 in the process of restoration movement of the transport vehicle 30. Alternatively, the transport placing base 31 may be raised or lowered while the transport vehicle 30 is not moving but stopped.

(5) The above embodiment has described an example in which there are two manners of the operation of the delivery of an article 8 by the transport vehicle 30, namely direct transfer and load receiving base transfer. However, the present invention is not limited to this example, and the operation of at least one of direct transfer and load receiving base transfer need only be included in the operation of the delivery of an article 8 by the transport vehicle 30. For example, if the load receiving base P (delivery-side load receiving base 21P) is not provided at the delivery location 20, only an article 8 being taken out of the transport placing base 31 (direct transfer) is the operation of the delivery of an article 8 by the transport vehicle 30.

(6) The above embodiment has described, as an example, a configuration in which both direct transfer and load receiving base transfer can be performed at both the receiving location 10 and the delivery location 20 in the article transport device 100. However, the present invention is not limited to this example, and a configuration may also be employed in which direct transfer is not performed and only load receiving base transfer is performed at at least one of the receiving location 10 and the delivery location 20.

(7) Note that the configurations disclosed in the above embodiments may also be combined with the configurations disclosed in the other embodiments, provided there is no inconsistency. As to other configurations as well, the embodiments disclosed in the present specification are merely examples in all respects. Accordingly, various alterations may be made as appropriate without departing from the gist of the present disclosure.

3. Summary of Above Embodiment

A summary of the above-described article transport device will be described below.

An article transport device according to the present disclosure is an article transport device for transporting an article from a receiving location to a delivery location including: a transport vehicle configured to move back and forth between the receiving location and the delivery location; a path forming portion configured to connect the receiving location to the delivery location and to form a path through which the transport vehicle moves; and a load receiving base provided at at least the receiving location, wherein the transport vehicle includes a transport placing base on which an article is to be placed, and a lift device configured to raise and lower the transport placing base to a first height and to a second height that is lower than the first height, the load receiving base is a base on which an article is to be placed, and is fixed at a third height that is between the first height and the second height, the transport vehicle receives an article at the receiving location as a result of the article being placed onto the transport placing base positioned at the first height, or as a result of the transport placing base being raised from the second height to the first height with the article placed on the load receiving base, and the article being placed onto the transport placing base, and delivers the article at the delivery location, and when the transport vehicle performs restoration movement to move from the delivery location to the receiving location, the lift device performs a restoration operation that differs in accordance with whether or not an article is present on the load receiving base at the receiving location.

According to this configuration, if an article is received by being placed onto the transport placing base positioned at the first height, the transport placing base waits in the first-height state at the receiving location, and thus, the article can be directly received at the transport placing base. Accordingly, transport of the article to the delivery location can be started early. Also, according to this configuration, different restoration operations are performed in accordance with the situation after the article is delivered at the delivery location, and thus, a preparation operation for transporting the next article can be performed efficiently. The above configuration makes it possible to cause the transport placing base to operate efficiently, and shorten the cycle time of the article transport device.

Here, it is preferable that the load receiving base is provided at each of the receiving location and the delivery location, the transport vehicle delivers an article at the delivery location as a result of the article being taken out of the transport placing base positioned at the first location, or as a result of the transport placing base being lowered from the first height to the second height with the article placed on the transport placing base, and the article being placed onto the load receiving base, and when the transport vehicle performs restoration movement to move from the delivery location to the receiving location, the lift device performs a restoration operation that differs in accordance with a height of the transport placing base after an article has been delivered at the delivery location, in addition to whether or not an article is present on the load receiving base at the receiving location.

According to this configuration, if an article is delivered by being taken out of the transport placing base positioned at the first height, the article can be directly delivered from the transport placing base by causing the transport placing base to wait in the first height state at the delivery location. On the other hand, if an article is delivered by being placed onto the load receiving base, the transport vehicle need not be stopped at the delivery location, and accordingly, the transport vehicle can be moved to the receiving location early. Furthermore, according to this configuration, in either state where the height of the transport placing base after the article has been delivered is the first height or the second height, a preparation operation for transporting the next article can be efficiently performed by performing different restoration operations in accordance with the situation.

Also, it is preferable that the lift device performs the restoration operation so as to set the transport placing base at the first height before the transport vehicle arrives at the receiving location, if no article is present on the load receiving base at the receiving location, and so as to set the transport placing base at the second height before the transport vehicle arrives at the receiving location, if an article is present on the load receiving base at the receiving location.

According to this configuration, if no article is present on the load receiving base at the receiving location, the transport placing base is set at the first height before arriving at the receiving location, and thus, the transport placing base need only wait at first height at the receiving location. Accordingly, preparation for receiving the next article can be performed efficiently. If an article is present on the load receiving base at the receiving location, the transport placing base is set at the second height before arriving at the receiving location, and thus, interference between the article on the load receiving base at the receiving location and the transport placing base can be avoided during restoration movement of the transport vehicle.

Also, it is preferable that the lift device keeps a height of the transport placing base during the restoration movement of the transport vehicle, if the height of the transport placing base after an article has been delivered at the delivery location is the same as the height of the transport placing base after the restoration operation has been completed, and changes the height of the transport placing base during the restoration movement of the transport vehicle, if the height of the transport placing base after an article has been delivered at the delivery location differs from the height of the transport placing base after the restoration operation has been completed.

According to this configuration, a change in the height of the transport placing base during the restoration operation of the lift device can be kept to the minimum. Accordingly, a preparation operation for transporting the next article can be performed efficiently.

Here, it is preferable that, when changing the height of the transport placing base during the restoration movement of the transport vehicle, the lift device gradually raises or lowers the transport placing base in accordance with movement of the transport vehicle.

According to this configuration, the transport placing base can be raised or lowered in parallel with movement of the transport vehicle, and accordingly, the cycle time can be further shortened.

Also, it is preferable that the lift device performs a first restoration operation to keep a height of the transport placing base at the first height during the restoration movement of the transport vehicle, if the height of the transport placing base after an article has been delivered at the delivery location is the first height, and no article is present on the load receiving base at the receiving location, performs a second restoration operation to lower the height of the transport placing base from the first height to the second height during the restoration movement of the transport vehicle, if the height of the transport placing base after an article has been delivered at the delivery location is the first height, and an article is present on the load receiving base at the receiving location, performs a third restoration operation to raise the height of the transport placing base from the second height to the first height during the restoration movement of the transport vehicle, if the height of the transport placing base after an article has been delivered at the delivery location is the second height, and no article is present on the load receiving base at the receiving location, and performs a fourth restoration operation to keep the height of the transport placing base at the second height during the restoration movement of the transport vehicle, if the height of the transport placing base after an article has been delivered at the delivery location is the second height, and an article is present on the load receiving base at the receiving location.

According to this configuration, an appropriate restoration operation can be selected from the first to fourth restoration operations, which are different operations, based on the height of the transport placing base after an article has been delivered at the delivery location, and on whether or not an article is present on the load receiving base at the receiving location, and the selected restoration operation can be performed. Accordingly, the transport placing base can be operated efficiently, and the cycle time of the article transport device can be shortened.

Also, it is preferable that at least one of a take-in device configured to take an article into the receiving location and a take-out device configured to take an article out of the delivery location is a lift of a suspended type included in a moving body configured to move above the receiving location or the delivery location, and the lift has a holding portion capable of holding an article, and is configured to approach the transport placing base or the load receiving base from above.

This configuration can be preferably used in a facility that is equipped with a moving body that moves above the receiving location or the delivery location and includes a lift of a suspended type.

Here, it is preferable that at least one of a take-in device configured to take an article into the receiving location and a take-out device configured to take an article out of the delivery location is an extension/withdrawal fork included in a moving body configured to relatively move with respect to the receiving location or the delivery location, the extension/withdrawal fork has a support portion configured to perform extending and withdrawing operations and ascending and descending operations and to be capable of supporting an article from below, and is configured to approach the receiving location or the delivery location from an outer side along a horizontal direction, and the transport placing base or the load receiving base is configured to not interfere with the extension/withdrawal fork.

This configuration can be preferably used in a facility that is equipped with a moving body that relatively moves with respect to the receiving location or the delivery location and includes an extension/withdrawal fork.

The technology according to the present disclosure can be used in an article transport device for transporting an article from a receiving location to a delivery location.

What is claimed is:

1. An article transport device for transporting an article from a receiving location to a delivery location comprising:
   a transport vehicle configured to move back and forth between the receiving location and the delivery location;
   a path forming portion configured to connect the receiving location to the delivery location and to form a path through which the transport vehicle moves; and
   a load receiving base provided at at least the receiving location,
   wherein:
   the transport vehicle includes a transport placing base on which an article is to be placed, and a lift device configured to raise and lower the transport placing base to a first height and to a second height that is lower than the first height,
   the load receiving base is a base on which an article is to be placed, and is fixed at a third height that is between the first height and the second height,
   the transport vehicle receives an article at the receiving location as a result of the article being placed onto the transport placing base positioned at the first height, or as a result of the transport placing base being raised from the second height to the first height with the article placed on the load receiving base, and the article being placed onto the transport placing base, and delivers the article at the delivery location, and
   when the transport vehicle performs restoration movement to move from the delivery location to the receiving location, the lift device performs a restoration operation that differs in accordance with whether or not an article is present on the load receiving base at the receiving location.

2. The article transport device according to claim 1, wherein the load receiving base is provided at each of the receiving location and the delivery location,
   wherein the transport vehicle delivers an article at the delivery location as a result of the article being taken out of the transport placing base positioned at the first location, or as a result of the transport placing base being lowered from the first height to the second height with the article placed on the transport placing base, and the article being placed onto the load receiving base, and
   wherein when the transport vehicle performs restoration movement to move from the delivery location to the receiving location, the lift device performs a restoration operation that differs in accordance with a height of the transport placing base after an article has been delivered at the delivery location, in addition to whether or not an article is present on the load receiving base at the receiving location.

3. The article transport device according to claim 1, wherein the lift device performs the restoration operation so as to set the transport placing base at the first height before the transport vehicle arrives at the receiving location, if no article is present on the load receiving base at the receiving location, and so as to set the transport placing base at the second height before the transport vehicle arrives at the receiving location, if an article is present on the load receiving base at the receiving location.

4. The article transport device according to claim 1, wherein the lift device keeps a height of the transport placing base during the restoration movement of the transport vehicle, if the height of the transport placing base after an article has been delivered at the delivery location is the same as the height of the transport placing base after the restoration operation has been completed, and
   wherein the lift device changes the height of the transport placing base during the restoration movement of the transport vehicle, if the height of the transport placing base after an article has been delivered at the delivery location differs from the height of the transport placing base after the restoration operation has been completed.

5. The article transport device according to claim 4, wherein, when changing the height of the transport placing base during the restoration movement of the transport vehicle, the lift device gradually raises or lowers the transport placing base in accordance with movement of the transport vehicle.

6. The article transport device according to claim 1, wherein the lift device:
- performs a first restoration operation to keep a height of the transport placing base at the first height during the restoration movement of the transport vehicle, if the height of the transport placing base after an article has been delivered at the delivery location is the first height, and no article is present on the load receiving base at the receiving location,
- performs a second restoration operation to lower the height of the transport placing base from the first height to the second height during the restoration movement of the transport vehicle, if the height of the transport placing base after an article has been delivered at the delivery location is the first height, and an article is present on the load receiving base at the receiving location,
- performs a third restoration operation to raise the height of the transport placing base from the second height to the first height during the restoration movement of the transport vehicle, if the height of the transport placing base after an article has been delivered at the delivery location is the second height, and no article is present on the load receiving base at the receiving location, and
- performs a fourth restoration operation to keep the height of the transport placing base at the second height during the restoration movement of the transport vehicle, if the height of the transport placing base after an article has been delivered at the delivery location is the second height, and an article is present on the load receiving base at the receiving location.

7. The article transport device according to claim 1, wherein at least one of a take-in device configured to take an article into the receiving location and a take-out device configured to take an article out of the delivery location is a lift of a suspended type included in a moving body configured to move above the receiving location or the delivery location, and
wherein the lift has a holding portion capable of holding an article, and is configured to approach the transport placing base or the load receiving base from above.

8. The article transport device according to claim 1, wherein at least one of a take-in device configured to take an article into the receiving location and a take-out device configured to take an article out of the delivery location is an extension/withdrawal fork included in a moving body configured to relatively move with respect to the receiving location or the delivery location,
wherein the extension/withdrawal fork has a support portion configured to perform extending and withdrawing operations and ascending and descending operations and to be capable of supporting an article from below, and is configured to approach the receiving location or the delivery location from an outer side along a horizontal direction, and
wherein the transport placing base or the load receiving base is configured to not interfere with the extension/withdrawal fork.

* * * * *